US009196303B2

(12) United States Patent
Hirano et al.

(10) Patent No.: US 9,196,303 B2
(45) Date of Patent: Nov. 24, 2015

(54) FEEDTHROUGH CONNECTOR FOR HERMETICALLY SEALED ELECTRONIC DEVICES

(71) Applicant: HGST Netherlands B.V., Amsterdam (NL)

(72) Inventors: Toshiki Hirano, San Jose, CA (US); Vipin Ayanoor-Vitikkate, San Jose, CA (US)

(73) Assignee: HGST NETHERLANDS, B.V., Amsterdam (NL)

( * ) Notice: Subject to any disclaimer, the term of this patent is extended or adjusted under 35 U.S.C. 154(b) by 0 days.

(21) Appl. No.: 14/199,133

(22) Filed: Mar. 6, 2014

(65) Prior Publication Data
US 2015/0257293 A1    Sep. 10, 2015

(51) Int. Cl.
  *G11B 25/04*   (2006.01)
  *G11B 33/12*   (2006.01)
  *G11B 33/14*   (2006.01)
  *G11B 33/02*   (2006.01)

(52) U.S. Cl.
  CPC ............ *G11B 25/043* (2013.01); *G11B 33/122* (2013.01); *G11B 33/1446* (2013.01); *G11B 33/022* (2013.01)

(58) Field of Classification Search
  USPC ............ 360/97.12, 97.22, 99.15, 99.16, 99.2, 360/99.21, 99.23, 99.25
  See application file for complete search history.

(56) References Cited

U.S. PATENT DOCUMENTS

| | | | |
|---|---|---|---|
| 5,282,099 A * | 1/1994 | Kawagoe et al. | 360/99.19 |
| 5,337,202 A | 8/1994 | Jabbarai et al. | |
| 5,454,157 A * | 10/1995 | Ananth et al. | 29/603.03 |
| 5,541,787 A | 7/1996 | Jabbari et al. | |
| 5,816,861 A | 10/1998 | Cheng | |
| 5,931,697 A | 8/1999 | Jeong | |
| 5,956,213 A * | 9/1999 | Dague et al. | 360/256.2 |

(Continued)

FOREIGN PATENT DOCUMENTS

EP    0529345    3/1993

OTHER PUBLICATIONS

SGA Technologies, Multi Pin Feedthrough, http://www.sgatech.co.uk/glass-to-metal-seals/types-of-seal/multi-pin-feedthrough, Received Jan. 29, 2014, Retrieved Mar. 6, 2014.

(Continued)

*Primary Examiner* — Brian Miller
(74) *Attorney, Agent, or Firm* — Kunzler Law Group, PC

(57) ABSTRACT

The present disclosure relates to an apparatus that includes an electrical connector that is coupled to a housing and that extends through a feedthrough aperture in the housing. The electrical connector has an electrically insulating base that has multiple layers of electrically insulating material with electrical traces extending between the multiple layers. The electrically insulating base also has a first portion disposed in the interior cavity, a second portion disposed external to the interior cavity, and a sealing portion disposed between the inwardly positioned portion and the outwardly positioned portion. The electrical connector also includes a first plurality of electrical leads that are disposed on the outwardly positioned portion of the electrically insulating base and a second plurality of electrical leads disposed on the inwardly positioned portion of the electrically isolating base material. Each of the electrical leads is electrically coupled to a corresponding lead.

20 Claims, 7 Drawing Sheets

(56) References Cited

U.S. PATENT DOCUMENTS

| | | | |
|---|---|---|---|
| 5,994,975 A * | 11/1999 | Allen et al. | 333/26 |
| 6,129,579 A * | 10/2000 | Cox et al. | 439/493 |
| 6,168,459 B1 * | 1/2001 | Cox et al. | 439/495 |
| 6,305,975 B1 | 10/2001 | Steiner | |
| 6,454,572 B1 | 9/2002 | Konetski et al. | |
| 6,567,235 B2 * | 5/2003 | Kasetty et al. | 360/99.18 |
| 6,594,107 B2 * | 7/2003 | Hayakawa et al. | 360/99.16 |
| 6,678,112 B1 * | 1/2004 | Kaneko | 360/99.18 |
| 6,970,322 B2 * | 11/2005 | Bernett | 360/99.18 |
| 6,989,493 B2 | 1/2006 | Hipwell, Jr. et al. | |
| 7,016,145 B2 * | 3/2006 | Gunderson et al. | 360/99.18 |
| 7,123,440 B2 * | 10/2006 | Albrecht et al. | 360/99.18 |
| 7,599,147 B2 * | 10/2009 | Gunderson | 360/97.22 |
| 7,872,836 B2 | 1/2011 | Shindo et al. | |
| 7,876,527 B2 * | 1/2011 | Nakamiya et al. | 360/97.22 |
| 8,035,923 B2 | 10/2011 | Suzuki et al. | |
| 8,059,364 B1 * | 11/2011 | Andrikowich et al. | 360/99.22 |
| 8,098,454 B2 | 1/2012 | Kouno et al. | |
| 8,179,631 B2 | 5/2012 | Aoyagi et al. | |
| 8,194,348 B2 * | 6/2012 | Jacoby et al. | 360/99.25 |
| 8,279,552 B2 | 10/2012 | Stipe | |
| 8,373,075 B2 * | 2/2013 | Munns et al. | 174/260 |
| 8,749,914 B2 * | 6/2014 | Otake et al. | 360/97.12 |
| 2003/0022533 A1 | 1/2003 | Joo | |
| 2006/0002067 A1 * | 1/2006 | Gunderson et al. | 361/683 |
| 2006/0050429 A1 * | 3/2006 | Gunderson et al. | 360/97.01 |
| 2008/0171465 A1 | 7/2008 | Lauriano et al. | |
| 2008/0182431 A1 | 7/2008 | Evans | |
| 2008/0259503 A1 * | 10/2008 | Aoyagi et al. | 360/244 |
| 2009/0034113 A1 * | 2/2009 | Hashi et al. | 360/75 |
| 2009/0097163 A1 * | 4/2009 | Suzuki et al. | 360/245.8 |
| 2009/0097375 A1 | 4/2009 | Uefune et al. | |
| 2009/0168233 A1 * | 7/2009 | Kouno et al. | 360/97.01 |
| 2010/0068936 A1 | 3/2010 | Foster | |
| 2010/0328815 A1 * | 12/2010 | Nakatsuka et al. | 360/110 |
| 2011/0056731 A1 | 3/2011 | VandenEynden et al. | |
| 2012/0182645 A1 * | 7/2012 | Kurokawa et al. | 360/99.08 |
| 2013/0063838 A1 | 3/2013 | Otake et al. | |

OTHER PUBLICATIONS

European Search Report for European Application No. 15157645.1 dated Jul. 7, 2015.

Office Action for U.S. Appl. No. 14/518,853 dated Sep. 22, 2015.

* cited by examiner

FEEDTHROUGH CONNECTOR FOR HERMETICALLY SEALED ELECTRONIC DEVICES

FIELD

This disclosure relates generally to electrical connectors for electronic devices, and more particularly to feedthrough electrical connectors for hard disk drives.

BACKGROUND

Hard disk drives are commonly used for storing and retrieving digital information using rapidly rotating discs or platters coated with magnetic material. Digital information is transferred between a hard disk drive and a computing device by virtue of an electrical connector forming part of the hard disk drive. Conventional electrical connectors include non-feedthrough connectors (e.g., P2 connectors) and feedthrough connectors.

Feedthrough connectors are defined by a plurality of electrical connections extending from outside the housing of an electronic device, such as a hard disk drive, to within an interior cavity of the electronic device. The portion of the electrical connections external to the housing are electrically coupled to a mating electrical connector of a computing device, while the portion of the electrical connections internal to the housing are electrically coupled to various components within the interior cavity.

Conventional feedthrough connectors are often difficult to couple to the housing of an electronic device, especially in circumstances where the interior cavity of the housing is sealed and maintained at a certain condition (e.g., pressure, temperature, air composition, etc.). For example, certain hard disk drives greatly benefit from a housing that isolates the interior cavity and the contents of the hard disk drive from the atmosphere exterior to the housing.

Further, conventional feedthrough connectors often have a large footprint (e.g., cross-sectional area), thus contributing to the difficulty and/or expense of achieving a sufficiently strong, reliable, and properly sealed connection between the connector and the housing. Also, many of the materials used in constructing conventional feedthrough connectors can be expensive to work with and often require complex and expensive curing and treatment procedures.

SUMMARY

The subject matter of the present application has been developed in response to the present state of the art, and in particular, in response to the problems and needs associated with hard disk drives and associated electrical connectors that have not yet been fully solved by currently available systems. Accordingly, the subject matter of the present application has been developed to provide a feedthrough electrical connector, and associated apparatus, systems, and methods, that overcomes at least some of the above-discussed shortcomings of the prior art.

The present disclosure relates to an apparatus that includes a housing that has a feedthrough aperture. Further, the apparatus includes an electrical connector that is coupled to the housing and that extends through the feedthrough aperture. The electrical connector includes an electrically insulating base that has multiple laminated layers of insulating material with electrical traces extending between the multiple laminated layers. The electrically insulating base also has a first portion disposed in the interior cavity, a second portion disposed external to the interior cavity, and a sealing portion disposed between the inwardly positioned portion and the outwardly positioned portion. The sealing portion is the region that is sealed to the housing. In one embodiment, at least the sealing portion of the electrically insulating base has a minimal cross-sectional area. The electrical connector further includes a first plurality of electrical leads that are disposed on the outwardly positioned portion of the electrically insulating base. The electrical connector also includes a second plurality of electrical leads disposed on the inwardly positioned portion of the electrically isolating base material. Each electrical lead of the first plurality of electrical leads is electrically coupled to a respective electrical lead of the second plurality of electrical lead via electrical traces in the electrically insulating base.

In one embodiment, a seal between the sealing portion and the housing maintains the interior cavity as a hermetically sealed environment. For example, the interior cavity may contain a helium-enriched environment. The seal may be made by using one or more of solder, adhesive, and epoxy, the epoxy having a low helium permeability. The electrically insulating base may have a multilayered structure with electrical traces extending between adjacent layers for electrically interconnecting the electrical leads of the first plurality of electrical leads with a respective electrical lead of the second plurality of electrical leads.

The first plurality of electrical leads, according to one embodiment, may be disposed on one or both of opposing surfaces of the outwardly positioned portion of the electrically insulating base. The electrically insulating base may be made from a printed circuit board material and the cross-sectional area of the electrical connector may be less than about 200 square millimeters. In a further embodiment, the electrical connector may be even less than about 100 square millimeters. In one embodiment, electrical connector, at least in the sealing portion, has a cross-section of the sealing portion that is co-planar with the cross-sectional area of the feedthrough aperture comprises a first and second dimension, wherein the first dimension is at least 5 times the length of the second dimension. In one implementation, the outwardly positioned portion of the electrical connector may appear similar to a zero-insertion-force type connector. For example, the length and height of the electrical connector may be substantially greater than the width of the electrical connector, with the height of the electrical connector extending in a direction transverse to the housing.

The present disclosure also relates to a hard disk drive that includes a hermetically sealed housing substantially isolating a hard drive cavity from an exterior atmosphere. The housing includes a feedthrough aperture through which an electrical connector may extend. The electrical connector may be coupled to the housing to maintain the hermetic seal. The electrical connector includes an electrically insulating base that has an inwardly positioned portion disposed in the interior cavity, an outwardly positioned portion protruding into the exterior atmosphere, and a sealing portion disposed between the inwardly positioned portion and the outwardly positioned portion. The sealing portion is the region on the electrically insulating base that is used for coupling the electrical connector to the housing. The electrical connector also includes a first plurality of electrical leads disposed on at least one peripheral surface of the outwardly positioned portion of the electrically insulating base. The electrical connector further includes a second plurality of electrical leads disposed on the inwardly positioned portion of the electrically insulating base. Each electrical lead of the first plurality of electrical leads has a corresponding and interconnected electrical lead of the second plurality of electrical leads. A length of the electrically insulating base that extends transversely away from the aperture is longer than a width of the electrically insulating base that extends parallel to the aperture.

According to one embodiment, the second plurality of electrical leads is electrically connected to hard disk drive components within the interior cavity. The interior cavity may contain a helium-enriched environment and the electrical connector may be coupled to the housing via one or more of soldering, adhesive, and epoxy that has a low helium permeability. The electrically insulating base may have a multilayered structure with electrical traces extending between adjacent layers for interconnecting the first and second plurality of electrical leads. The apparatus may also include a securing mechanism that fastens the electrical connector in place. For example, the securing mechanism may secure the engagement between the electrical connector and a mating electrical receptacle. In one embodiment, the cross-sectional area of the electrical connector in the feedthrough aperture is less than about 100 square millimeters.

Finally, the application relates to a hard disk drive that includes a hermetically sealed housing substantially isolating a hard drive cavity containing a helium enriched environment from an exterior atmosphere, the housing comprising a feedthrough aperture. Further, an electrical connector is coupled to the housing and extends through the feedthrough aperture. The electrical connector includes an electrically insulating base that has an inwardly positioned portion disposed in the interior cavity, an outwardly positioned portion protruding into the exterior atmosphere, and a sealing portion disposed between the inwardly positioned portion and the outwardly positioned portion for coupling the electrical connector to the housing. The electrically insulating base has a multilayered structure with electrical traces extending between adjacent layers. The electrically insulating base may further include a first plurality of electrical leads disposed on one or both opposing peripheral surfaces of the outwardly positioned portion of the electrically insulating base. The base material may also include a second plurality of electrical leads disposed on the inwardly positioned portion of the electrically isolating base material, wherein each electrical lead of the first plurality of electrical leads has a corresponding and interconnected, via the electrical traces, electrical lead of the second plurality of electrical leads.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
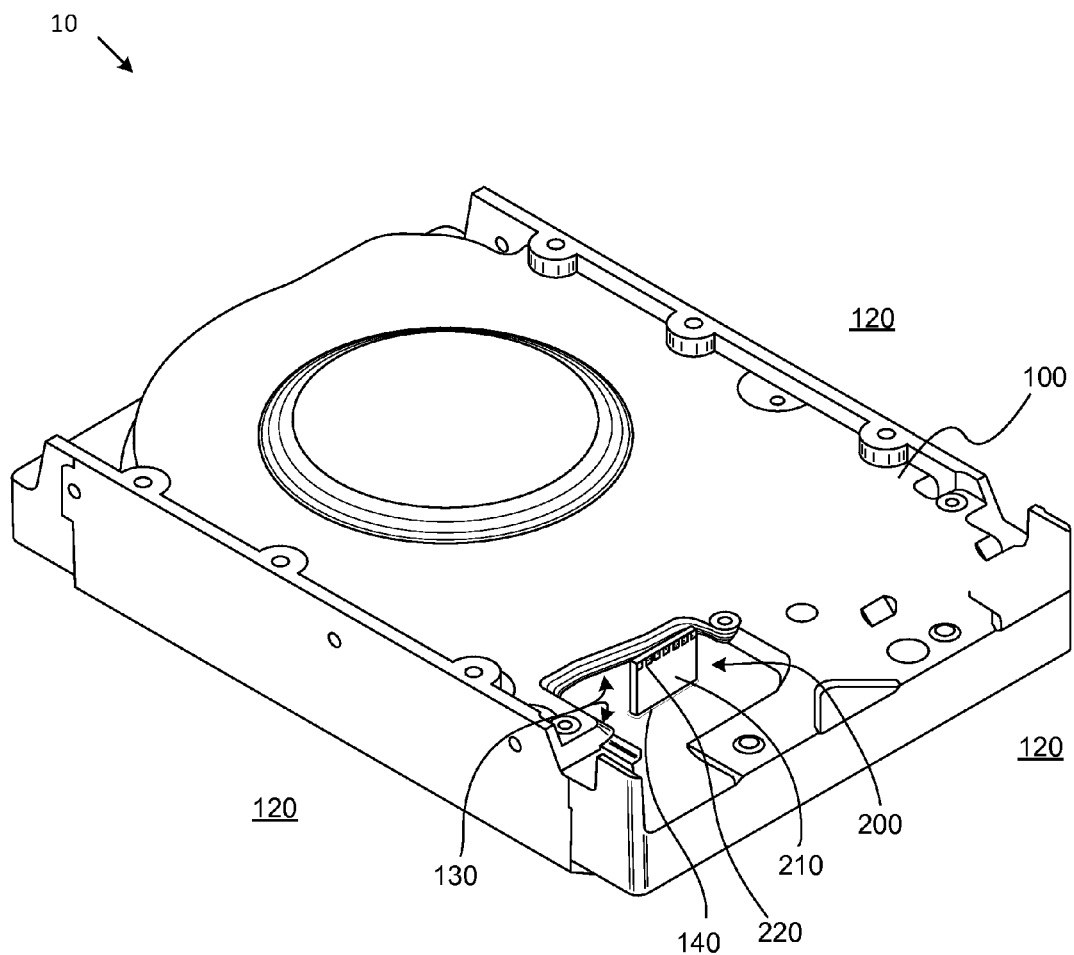
FIG. 1 is a perspective view of a hard disk drive with a feedthrough electrical connector, according to one embodiment.

FIG. 1 is a perspective view of a hard disk drive 10 with a feedthrough electrical connector 200 according to one embodiment. The hard disk drive 10 includes a housing 100 that defines an interior cavity 110 (not depicted in FIG. 1). The interior cavity 110 contains hard disks and other interior components 112 (not depicted in FIG. 1) of the hard disk drive 10. The feedthrough electrical connector 200 includes an electrically insulating base 210 with a plurality of electrical leads 220 disposed on at least one peripheral surface of the electrically insulating base 210. Generally, the feedthrough electrical connector 200 electrically connects the interior components 112 of the hard disk drive with a computing device (not shown) while still maintaining the interior cavity 110 of the hard disk drive relatively isolated from the exterior atmosphere 120. Additional details relating to the feedthrough electrical connector 200 are included below with reference to FIGS. 2-7.

Although the illustrated embodiments described below are in relation to a hard disk drive with an electrical connector, in other embodiments, the principles and features of the present disclosure can be applied to other electronic devices that could benefit from a feedthrough electrical connector, such as solid state memory devices, semiconductor devices, general computing devices, and the like.

The housing 100 of the hard disk drive 10 houses and protects the various internal components 112 configured to store and retrieve data and information, as well as control the storage and retrieval of data and information. The components 112 within the interior cavity 110 may include magnetic recording media (e.g., disks), read/write heads, actuators (e.g., swings arms), electrical circuitry, and the like. The hard disk drive 10 can be in electrical communication with a computing device (not shown) to transfer data for operation of the computing device. In one embodiment, the housing 100 is configured to hermetically seal the components 112 of the hard disk drive 10 from the exterior environment 120. In certain implementations, the housing 100 includes two or more sections coupled together to maintain the sealing nature of the housing. According to some implementations, the housing 100 maintains the interior cavity 110 of the housing of the hard disk drive 10 at a pressure below atmospheric pressure. Because the components of hard disk drives, according to one embodiment, are sensitive to contaminants and pressure changes, hermetically sealing the internal components 112 of the hard disk drive 10 from the exterior environment 120 promotes the proper operation of the hard disk drive 10 and also extends the life of the hard disk drive 10.

The housing 100, which can be made from any of various materials (such as hardened plastics, metal, and the like), may, in certain embodiments, include a connector receptacle 130. The connector receptacle 130 is formed in an exterior surface of the housing 100 about a feedthrough aperture 140, which is also formed in the housing. The feedthrough aperture 140, in the absence of the feedthrough electrical connector 200, is open to the interior cavity 110 of the hard disk drive 10. Generally, the connector receptacle 130 is configured to receive the electrical connector 200. Although shown in FIG. 1 as tray or indentation in the housing 100 that is substantially larger than the connector 200 and larger than the feedthrough aperture 140, in other embodiments, the connector receptacle 130 may be sized similar to the electrical connector 200 in order to physically support the protruding surfaces of the electrical connector 200. Further, the connector receptacle 130 may be useful for retaining a layer of solder, adhesive, or other weldment agent for securing the electrical connector 200 to the housing 100. Further details regarding coupling the connector 200 to the housing 100 are included below.

Figure 2:
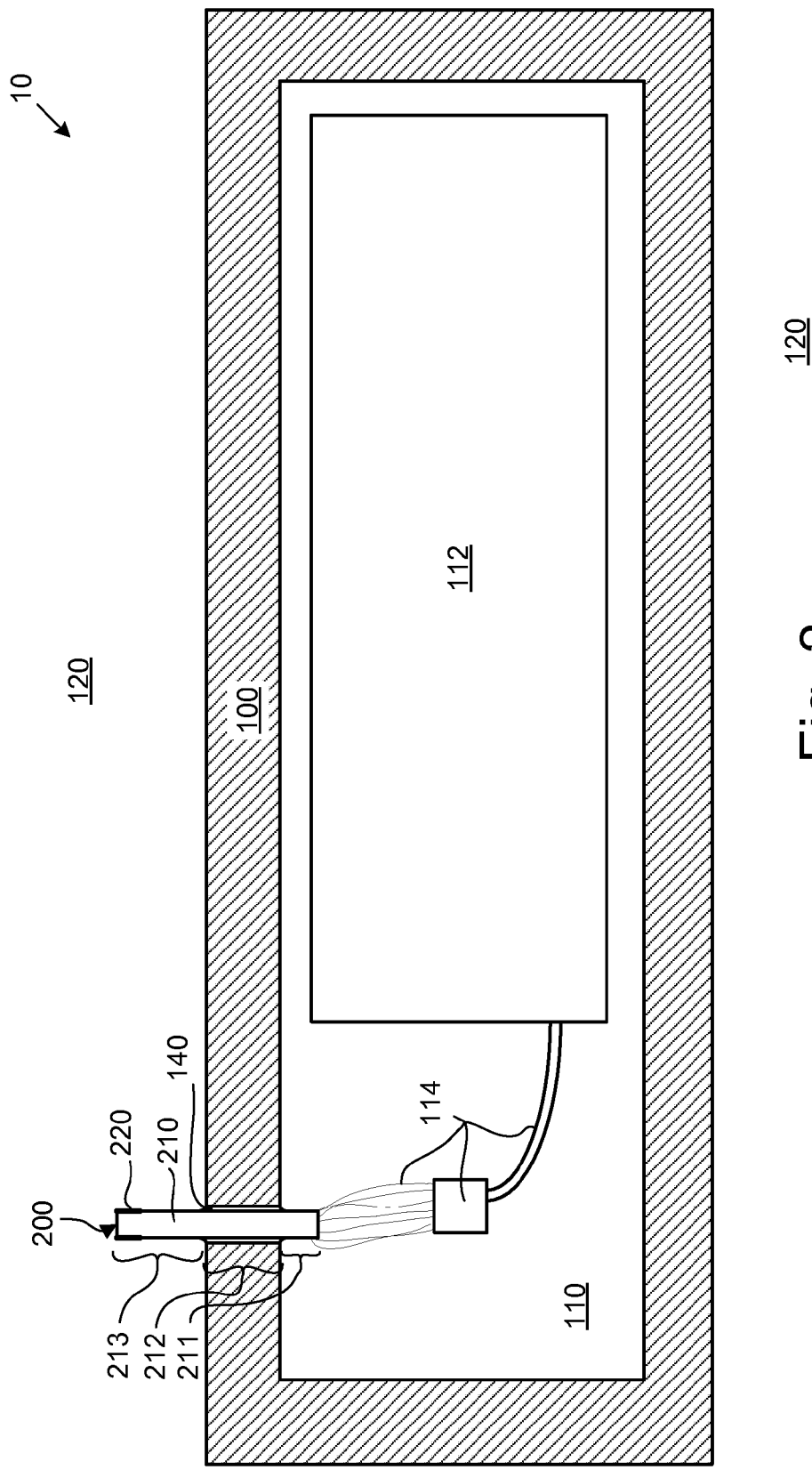
FIG. 2 is a cross-sectional side view of a hard disk with a feedthrough electrical connector according to one embodiment.

FIG. 2 is a schematic cross-sectional side view of a hard disk drive 10 with a feedthrough electrical connector 200 according to one embodiment. In the depicted embodiment, the hard disk drive 10 includes a housing 100 that substantially isolates the interior cavity 110 of the hard disk drive 10 from the exterior atmosphere 120. For example, the interior cavity 110 may have a helium enriched atmosphere or the interior cavity 110 may be maintained at a lower pressure than the pressure of the exterior atmosphere 120. Certain hard disk drives 10 are specifically configured to have or maintain certain conditions within the interior cavity 110 to promote the efficient operation of the hard disk drive 10. Leaks from the housing tend to disrupt the desired conditions within the interior cavity (e.g., cause an increase in pressure or introduction of heavier air), which can harm the efficiency and reliability of the hard disk drive 10.

Figure 3:
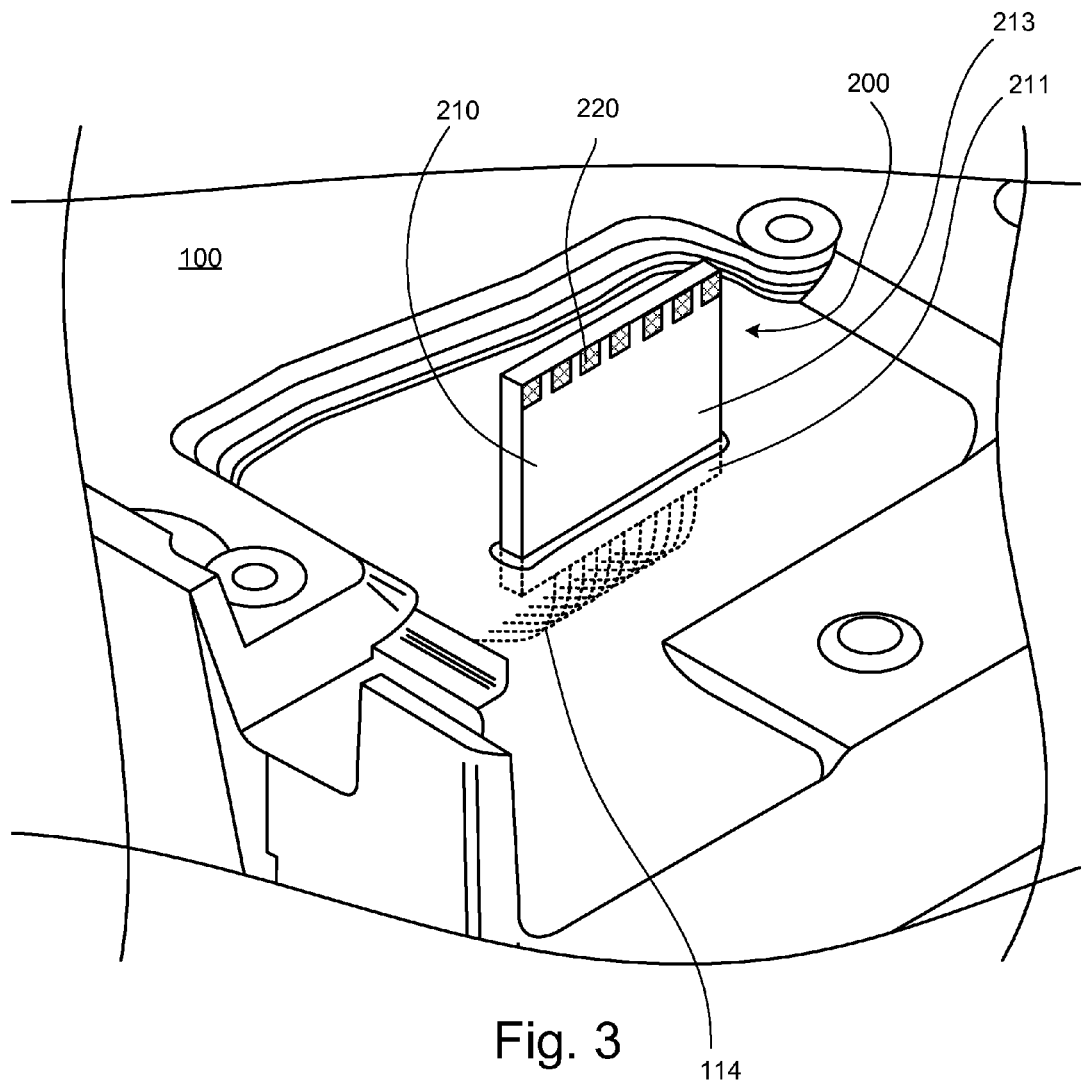
FIG. 3 is a magnified view of a feedthrough electrical connector on a hard disk drive according to one embodiment.
Figure 4:
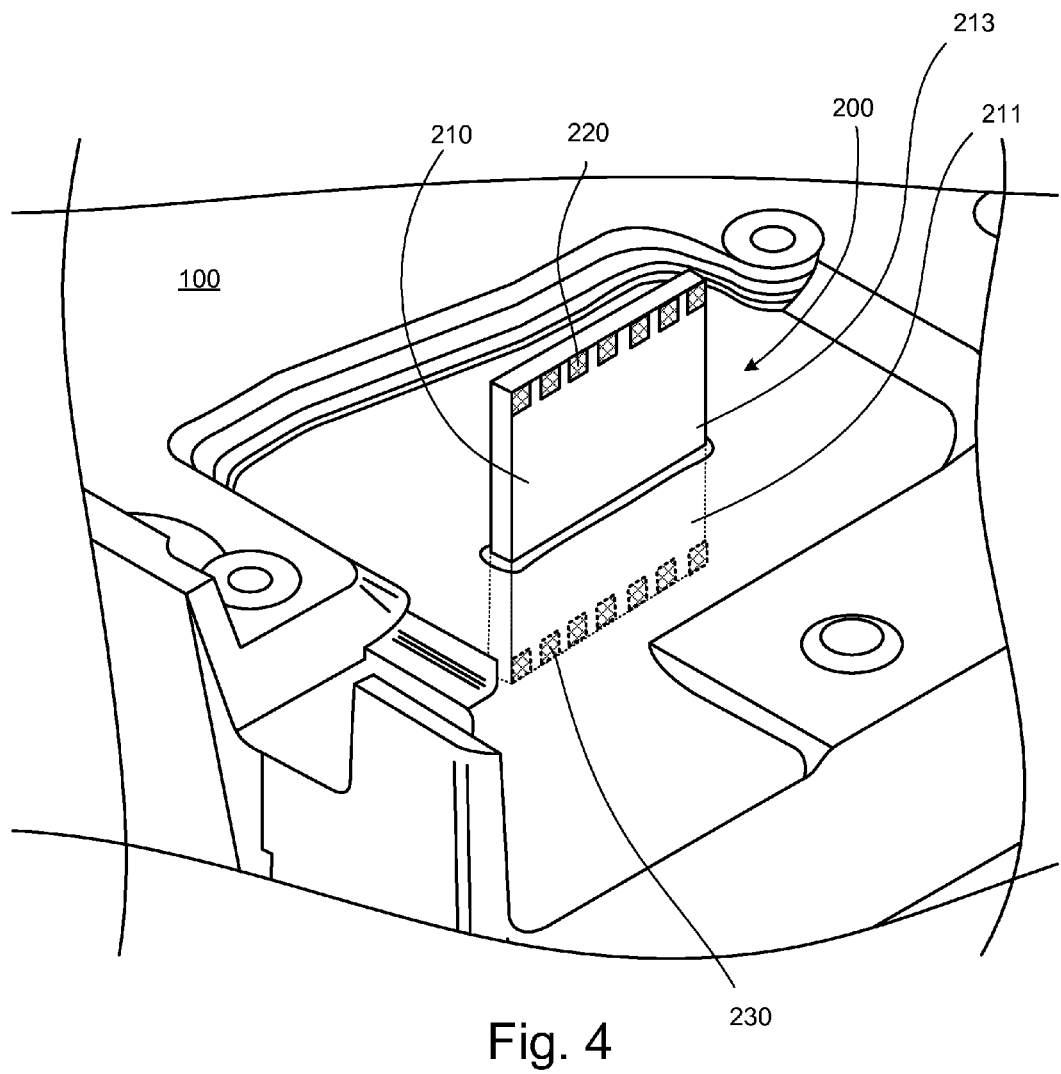
FIG. 4 is a magnified view of a feedthrough electrical connector on a hard disk drive according to another embodiment.

The embodiment of the housing 100 depicted in FIG. 2 does not include a connector receptacle 130 (as depicted in FIG. 1). The housing 100 holds the components 112 of the hard disk drive, such as magnetic media and read/write arms. Also depicted schematically in the interior cavity 110 of the hard disk drive 10 are secondary electrical connections 114 that electrically connect the components 112 of the hard disk drive 10 to the feedthrough electrical connector 200. The secondary electrical connections 114 may be wiring, electrical traces, connectors, controllers, control modules, and the like. Such secondary electrical connections 114 may be configured to connect with the feedthrough electrical connector 200 in a variety of ways. For example, FIGS. 3 and 4 show different implementations for connecting the internal wiring 114 of the hard disk drive 10 to the feedthrough electrical connector 200. Additional details regarding these different implementations are included below with reference to FIGS. 3 and 4.

Figure 7:
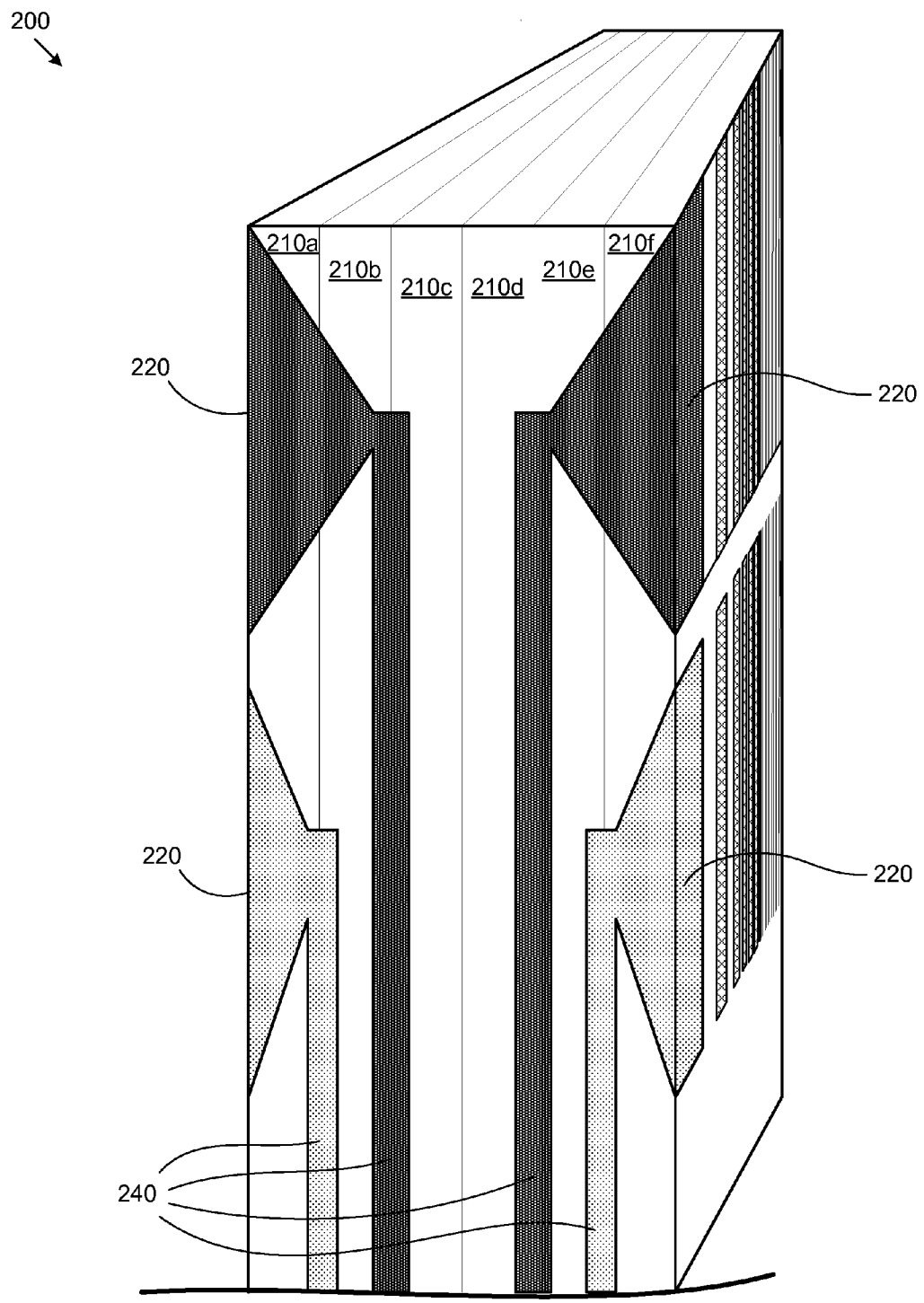
FIG. 7 is a magnified cross-sectional perspective view of a feedthrough electrical connector according to one embodiment.

The feedthrough electrical connector 200 includes an electrically insulating base 210 and a plurality of electrical leads 220. The electrically insulating base 210 may include multiple layers of electrically insulating material with electrical traces extending between adjacent layers. For example, the multiple layers may extend in a direction perpendicular to the cross-sectional area of the feedthrough aperture. The electrically insulating base 210 also includes three different portions or sections: an inwardly positioned portion 211, a sealing portion 212, and an outwardly positioned portion 213. Although described and referenced throughout the disclosure as three separate portions 211, 212, 213, it is contemplated that, according to one embodiment, the electrically insulating base 210 may be a single, integrated structure. In other embodiments, the electrically insulating base 210 may be modular such that each portion 211, 212, 213 is a separate material. Further, in one embodiment, the electrically insulating base 210 may be layered (FIG. 7). Additional details regarding the structure and composition of the electrically insulating base 210 are included below with reference to FIGS. 5A and 7.

The feedthrough electrical connector 200 of the present disclosure has at least a first plurality of electrical leads 220 on the outwardly positioned portion 213. The first plurality of electrical leads 220 may be disposed on at least one peripheral surface of the outwardly positioned portion 213. The arrangement, material, and structure of the leads 220 are described in greater detail below with reference to FIG. 5A-7. The first plurality of electrical leads 220 are electrically connected, via electrical traces/wires not depicted in FIG. 2, to corresponding contact points on the inwardly positioned portion 211 of the electrically insulated base material 210 for connecting with the components 112 of the hard disk drive 10.

Although described in greater detail below, the inwardly positioned portion 211 of the electrically insulating base 210 of the feedthrough electrical connector 200 may or may not have similarly situated electrical leads (see the description of FIGS. 3 and 4). For example, in one embodiment, the secondary electrical connections 114 may electrically connect to the electrical connector 200 via leads disposed on the inwardly positioned portion 211 of the electrically insulating base 210. However, in another embodiment, the inwardly positioned portion of the electrically insulating base 210 may resemble a conventional electrical connector that has electrical contact points for interfacing with the integrated wiring 114 and components 112 of the hard disk drive 10.

The sealing portion 212 is the portion/region of the feedthrough electrical connector 200 that engages the feedthrough aperture 140 and couples the connector 200 to the housing 100. In one embodiment, the sealing portion 212 is electroplated with a soldering metal or other weldment facilitator for coupling the connector 200 to the housing 100. In another embodiment, the sealing portion 212 couples to the feedthrough aperture 140 via an adhesive composition. Additional details relating to the sealing portion 212 are included below with reference to FIG. 5A.

FIG. 3 is magnified view of a feedthrough electrical connector 200 coupled to the housing 100 of the hard disk drive 10 of FIG. 1 according to one embodiment. Similar to the embodiment depicted in FIG. 2, the feedthrough electrical connector 200 has a first plurality of electrical leads 220 disposed on a distal end of the outwardly positioned portion 213 of the electrically insulating base 210. These leads 220 are configured to be inserted into a corresponding/mated receptacle. For example, the outwardly positioned portion 213 of the connector 200 may be a zero-insertion-force type of connector. However, FIG. 3 also shows one embodiment of the inwardly positioned portion 211 of the electrically insulating base 210 of the feedthrough electrical connector 200. The inwardly positioned portion 211 may include conventional electrical terminals configured to electrically connect with wiring/cables 114 within the interior cavity 110 of the hard disk drive 10. In another embodiment, the outwardly positioned portion 213 may include conventional electrical terminals.

FIG. 4 is a magnified view of a feedthrough electrical connector 200 coupled to the hard disk drive 10 of FIG. 1 according to another embodiment. Similar to the embodiments depicted in FIGS. 2 and 3, the feedthrough electrical connector 200 in FIG. 4 has a first plurality of electrical leads 220 disposed on a distal end of the outwardly positioned portion of the electrically insulating base 210. These leads 220 are configured to be inserted into a corresponding/mated receptacle. However, FIG. 4 shows a different embodiment of the inwardly positioned portion 211 of the electrically insulating base 210 of the feedthrough electrical connector 200 compared to FIG. 3. For example, the inwardly positioned portion 211 may have a second plurality of electrical leads 230 disposed on at least one peripheral surface of the inwardly positioned portion 211 of the connector 200. Although not depicted, the inwardly positioned portion 211 may be received into a mating receptacle that has electrical terminals configured to engage the second plurality of electrical leads 230.

Figure 5A:
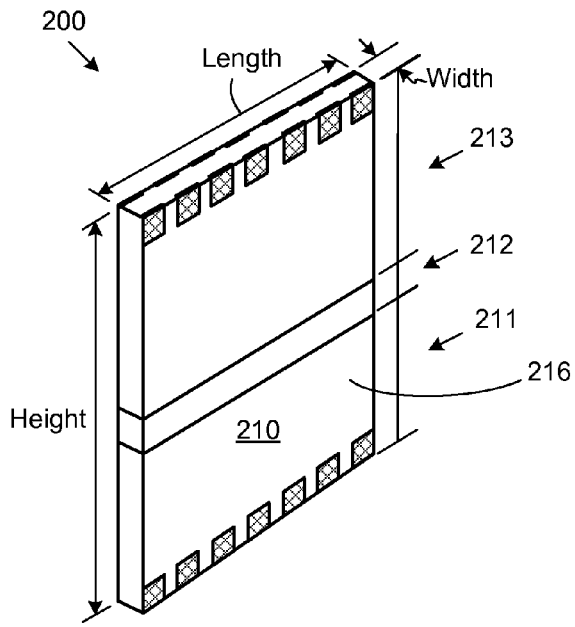
FIG. 5A is a perspective view of a feedthrough electrical connector according to one embodiment.

FIG. 5A is a perspective view of a feedthrough electrical connector 200 according to one embodiment. As described above, the feedthrough electrical connector 200 has an electrically insulating base 210 that defines the structure and overall shape of the connector 200. The electrically insulating base 210 may be any non-conductive material that is suited for use in an electrical device. For example, the electrically insulating base 210 may be glass, ceramic, rubber, plastic, polymer, and the like. In one embodiment, the electrically insulating base 210 may be constructed in the same manner as printed circuit boards, printed wiring boards, etched wiring boards, printed circuit board assemblies, or circuit card assemblies. The electrically insulating base 210 can include or be a printed circuit board 216. Although described in greater detail below with reference to FIG. 7, the electrically insulating base 210 includes electrical traces for conveying electric current and electrical signals between the first plurality of electrical leads 220 and the second plurality of electrical leads 230. In one embodiment, the electrically insulating base 210 implemented in the connector 200 may be selected according to the specific material's ability to withstand the conditions present in the interior cavity 110 of the hard disk drive 10. For example, if a helium enriched atmosphere is maintained in the interior cavity 110, an electrically insulating base 210 may be selected that has low helium permeability, thus promoting the isolation of the helium enriched interior cavity 110 from the exterior atmosphere 120.

The three portions 211, 212, 213 of the electrically insulating base 210 are also depicted in FIG. 5A. As described above, the three portions 211, 212, 213 may be a single, integrated structure. In other embodiments, the electrically insulating base 210 may be modular such that each portion 211, 212, 213 is a separate material. In one embodiment, the portions 211, 212, 213, may not be definitively marked and the portions may not be visually or structurally distinguishable from each other. In other words, the present disclosure distinguishes the portions 211, 212, 213 generally based on the expected arrangement and use of the feedthrough electrical connector 200. For example, the outwardly positioned portion 213 may be comparatively more rigid and may be constructed of a stronger non-conductive material so as to withstand the conditions of the exterior atmosphere and/or repeated connecting and disconnecting (depending on the specifics of a given application). Also, the comparative lengths and relative dimensions of the three portions 211, 212, 213 are only illustrative of one embodiment and are not intended to restrict the scope of the disclosure. In other words, one portion may be substantially larger, longer, and/or wider than another portion, depending on the specifics of a given application. Also, as described below, the number, size, configuration, and arrangement of the depicted electrical leads 220, 230 are not restrictive of the scope of the present disclosure. In one embodiment (as depicted) the width of electrically insulating base 210 is substantially smaller than the length and the height of the electrically insulating base 210.

The sealing portion 212 may simply be a medial region where the connector 200 is coupled to the housing 100. However, in another embodiment the external surfaces of the sealing portion 212 may be electroplated with a soldering material. In another embodiment, the sealing portion 212 may include a prepared surface that is capable of bonding, through the use of an adhesive or epoxy, to the feedthrough aperture 140. In yet another embodiment, both and adhesive and solder (or other weldment agent) may be implemented to seal the connector 200 within the feedthrough aperture 140, thus substantially maintaining the interior cavity 110 isolated from the exterior atmosphere 120. For example, in one embodiment, electroplating material may be disposed along the length of the sealing portion 212 and an adhesive may be disposed along the width of the sealing portion 212. As briefly described above, the sealing portion 212 may not only be the region of the connector 200 that is directly engaged with the housing 100. In one embodiment, the sealing portion 212 may extend beyond the thickness of the feedthrough aperture 140 of the housing 100. Once again, the adhesive and/or the solder may be selected according to its ability to withstand the expected conditions within the interior cavity 110 or the exterior atmosphere 120 (e.g., low helium permeability).

The electrically insulating base 210 may have a cross-sectional area, at least at the sealing portion, that is less than about 200 square millimeters. In a further embodiment, the cross-sectional area of the electrical connector may be less than about 100 square millimeters. In one embodiment, the electrical connector, at least in the sealing portion, has a cross-section that is co-planar with the cross-sectional area of the feedthrough aperture and that includes a first and second dimension. The first dimension, according to one embodiment, is substantially longer than the second direction. For example, the first dimension may be at least 5 times the length of the second dimension. In another implementation, the first dimension is at least 10 times the length of the second dimension.

Figure 5B:
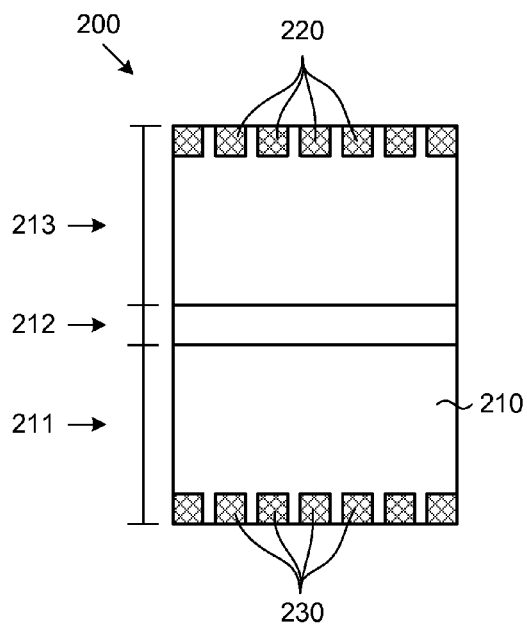
FIG. 5B is a front view of the feedthrough electrical connector of FIG. 5A.

FIG. 5B is a front view of the feedthrough electrical connector 200 of FIG. 5A, according to one embodiment. As described and shown in FIGS. 3 and 4, the electrical connector 200 has a first plurality of leads 220 disposed on the outwardly positioned portion 213 and a second plurality of leads 230 disposed on the inwardly positioned portion 211. The first 220 and second plurality of leads 230 are interconnected via traces/wiring extending the length of the electrically insulating base 210 (see FIG. 7). As described above, the first plurality of electrical leads 220 are disposed on at least one peripheral surface of the outwardly positioned portion 213 of the connector 200. However, the second plurality of electrical leads 230, while they may be similar in arrangement and configuration to the first plurality of electrical leads 220 (as depicted in FIGS. 4 and 5A-5C), in another embodiment may have the structure and configuration of a conventional electrical connector (i.e., electrical terminals, electrical contacts, wire couplings, etc.).

The leads 220, 230 may be constructed from any electrically conductive material that is suited for use in an electrical device. For example, the electrical leads 220, 230 may be constructed of metals such as copper, aluminum, gold, zinc, nickel, brass, bronze, iron, platinum, etc. In another embodiment, the electrical leads 220, 230 may be constructed of other conductive materials, such as graphite and conductive polymers. The number of leads in the first plurality of electrical leads 220 is not limited to the number depicted in the Figures. In one embodiment, the feedthrough electrical connector 200 may less than 20 associated electrical leads. However, in another embodiment the feedthrough electrical connector 200 may have more than 20 associated electrical leads (i.e., hundreds or thousands) depending on the specifics of a given application.

Figure 5C:
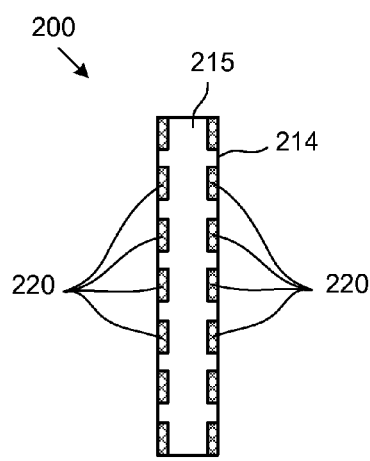
FIG. 5C is a top view of the feedthrough electrical connector of FIG. 5A.

FIG. 5C is a top view of the feedthrough electrical connector 200 of FIG. 5A, according to one embodiment. As depicted, the first plurality of electrical leads 220 may be disposed on opposing lateral peripheral sides 214 of the outwardly positioned portion 213 of the electrically insulating base 210. Additionally, the electrical leads 220, or at least a portion of the electrical leads 220, may be exposed on the leading edge 215 of the connector 200, thus allowing a mating connector to electrically engage the leads 220 on the peripheral sides 214 and/or the leading edge/surface 215 of the feedthrough connector 200. Also, the first plurality of electrical leads 220 may be disposed on all the lateral sides 214 of the feedthrough connector 200 instead of just two opposing sides. In another embodiment, the leads 220 may only be disposed on a single side. Further details and embodiments relating to the shape of the connector 200 and the arrangement of the leads 220 are included below.

Figure 6A:
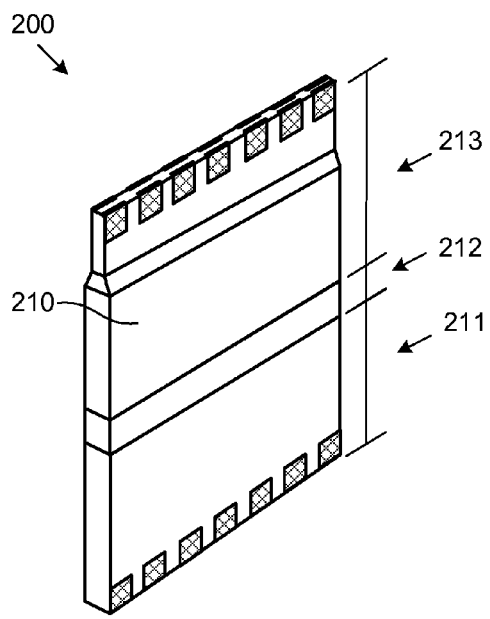
FIG. 6A is a perspective view of a feedthrough electrical connector according to another embodiment.

FIG. 6A is a perspective view of a feedthrough electrical connector 200, according to another embodiment. The feedthrough electrical connector 200 may have a tapered design, thus potentially making the insertion of the outwardly positioned portion 213 into a mating receptacle (not shown) easier. In another embodiment (not shown), sealing portion 212 may be tapered so as to reduce the effective footprint (cross-sectional area) of the connector 200, thus reducing the size of the feedthrough aperture 140 and reducing the likelihood of leakage between the interior cavity 110 and the exterior atmosphere 120 or rendering the sealing process more efficient/effective. In one embodiment, the cross-sectional area of the electrical connector 200, at least at the sealing portion 212, is less than about 200 square millimeters. In another embodiment, the cross-sectional areal of the electrical connector 200 is less than about 100 square millimeters. Conventional feedthrough connectors often have comparatively wider footprints, thus increasing the likelihood of leakage and/or making the sealing process difficult/expensive.

Figure 6B:
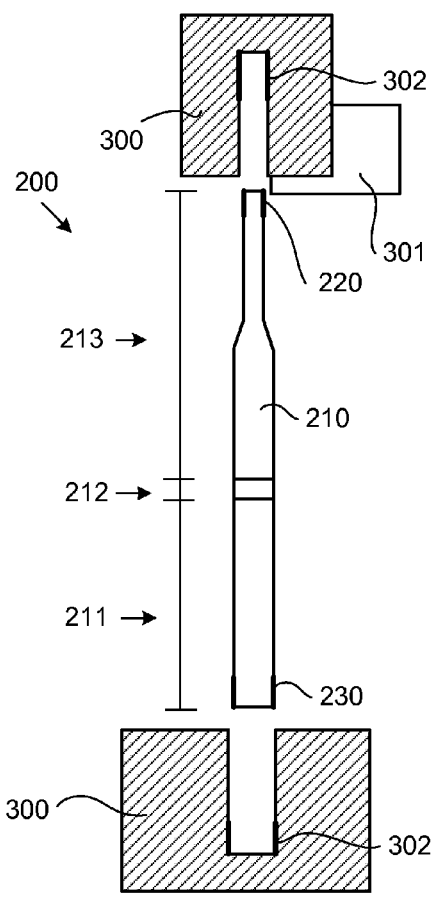
FIG. 6B is a side view of the feedthrough electrical connector of FIG. 6A with corresponding electrical contacts according to one embodiment.

FIG. 6B is a side view of the feedthrough electrical connector 200 of FIG. 6A with corresponding mating receptacles 300, according to one embodiment. The mating receptacles 300 have electrical contact pads 302 that, upon inserting the proper portion of the feedthrough electrical connector 200 into the receptacle, the leads 220, 230 engage the electrical contact pads 302 and an electrical connection is made. The mating receptacles 300 may be electrically coupled to other components. The mating receptacles 300 and/or the feedthrough electrical connector 200 may have a securing mechanism 301 that fastens the connector in place. The securing mechanism 301 may be a latch, a clamp, a tie, a fastener, a bolt, clasp, pin, clip, etc. In another embodiment, the connector may be held in place merely by the snug fit of the connector 200 within the mating receptacle(s) 300.

As described above, the number, configuration, arrangement, and general dimensions of the leads 220, 230 are not restricted to the embodiments depicted in the Figures. Additionally, it is contemplated that the connector may have shapes other than those depicted and described in the present disclosure. For example, the electrical connector may have a generally racetrack-shaped, ellipse-shaped, or ovular-shaped outer periphery. In other words the outer perimeter of the electrical connector 200, or at least the outer perimeter of one of the portions 211, 212, 213 of the connector 200, may have various shapes. For example, the outer perimeter of the connector 200 may include two opposing sides extending substantially parallel to each other, with the sides being coupled together by semi-circular ends. In another embodiment, the outer perimeter (i.e., footprint) of the connector 200 may have a circular shape. In contrast to traditional feedthrough connectors, the connector 200 may be void of relatively sharp corners or edges.

FIG. 7 is a magnified perspective view of a feedthrough electrical connector 200, according to one embodiment. The electrical connector 200 includes leads 220 disposed on peripheral surfaces of the electrically insulating base 210. As depicted, multiple leads 220 may be spaced apart in multiple directions across the peripheral surfaces of the electrically insulating base 210. For example, the not only can the leads 220 be spaced apart across the width of the connector 200, the leads 220 may be spaced apart down the length of the connector 200. The electrically insulating base 210 may include multiple layers 210a, 210b, 210c, 210d, 210e, 210f formed together. In between adjacent layers, electrical traces 240 can be electrically connected to the leads 220 and extend the length of the connector 200 to connect with corresponding leads/contact points 230 on the opposite end (e.g., between the inwardly positioned portion 211 to the outwardly positioned portion 213). The electrical traces 240 may be constructed from any electrically conductive material that is suited for use in an electrical device. For example, the electrical traces 240 may be constructed of metals such as copper, aluminum, gold, zinc, nickel, brass, bronze, iron, platinum, etc. In another embodiment, the electrical traces 240 may be constructed of other conductive materials, such as graphite and conductive polymers. The number and configuration of the traces 240 and the layers 210a, 210b, 210c, 210d, 210e, 210f is not limited to the depicted embodiment. Depending on the specifics of a given application, many layers 210a, 210b, 210c, 210d, 210e, 210f may be incorporated to properly route the traces 240.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
    a housing comprising a feedthrough aperture; and
    an electrical connector coupled to the housing and extending through the feedthrough aperture, the electrical connector comprising:
        an electrically insulating base comprising at least first, second, and third layers of electrically insulating material with at least a first electrical trace extending between the first and second layers of electrically insulating material and at least a second electrical trace extending between the second and third layers of electrically insulating material, the electrically insulating base comprising an inwardly positioned portion disposed in an interior cavity, an outwardly positioned portion disposed external to the interior cavity, and a sealing portion disposed between the inwardly positioned portion and the outwardly positioned portion, the sealing portion being sealed to the housing;
        at least first and second electrical leads disposed on a same surface of the outwardly positioned portion of the electrically insulating base; and
        at least third and fourth electrical leads disposed on the inwardly positioned portion of the electrically insulating base, wherein the first electrical lead is electrically coupled to the third electrical lead via the first electrical trace and the second electrical lead is electrically coupled to the fourth electrical lead via the second electrical trace.

2. The apparatus of claim 1, wherein a seal between the sealing portion and the housing maintains the interior cavity as a hermetically sealed environment.

3. The apparatus of claim 2, wherein the interior cavity contains a helium-enriched environment.

4. The apparatus of claim 3, wherein the seal comprises one or more of solder, adhesive, and epoxy, the epoxy having a low helium permeability.

5. The apparatus of claim 1, wherein the first, second, and third layers of electrically insulating material extend through the feedthrough aperture of the housing perpendicular to a cross-section of the feedthrough aperture.

6. The apparatus of claim 1, wherein the electrically insulating base extends from the inwardly positioned portion to the outwardly positioned portion in a first direction, and wherein the first electrical lead is offset from the second electrical lead in the first direction.

7. The apparatus of claim 1, wherein the electrically insulating base comprises a printed circuit board.

8. The apparatus of claim 1, wherein a cross-sectional area of the electrical connector is less than about 200 square millimeters.

9. The apparatus of claim 1, wherein the cross-sectional area of the electrical connector in the feedthrough aperture is less than about 100 square millimeters.

10. The apparatus of claim 1, wherein the outwardly positioned portion of the electrical connector comprises a zero-insertion-force type connector.

11. The apparatus of claim 1, wherein a length and a height of the electrical connector are substantially greater than a width of the electrical connector, wherein the height of the electrical connector extends in a direction transverse to a cross-section of the feedthrough aperture and the length and width of the electrical connector extend in directions parallel to the cross-section of the feedthrough aperture.

12. A hard disk drive, comprising:
    a hermetically sealed housing substantially isolating a hard drive cavity from an exterior atmosphere, the housing comprising a feedthrough aperture; and
    an electrical connector coupled to the housing and extending through the feedthrough aperture, the electrical connector comprising:
        an electrically insulating base comprising at least first, second, and third layers of electrically insulating material with at least a first electrical trace extending between the first and second layers of electrically insulating material and at least a second electrical trace extending between the second and third layers of electrically insulating material, the electrically insulating base comprising an inwardly positioned portion disposed in the hard drive cavity, an outwardly positioned portion protruding into the exterior atmosphere, and a sealing portion disposed between the inwardly positioned portion and the outwardly positioned portion, the sealing portion being sealed to the housing wherein a length of the electrically insulating base extending transversely away from the feedthrough aperture is longer than a width of the electrically insulating base extending parallel to the feedthrough aperture, at least first and second electrical leads disposed on a same peripheral surface of the outwardly positioned portion of the electrically insulating base, and at least third and fourth electrical leads disposed on the inwardly positioned portion of the electrically insulating base, wherein the first electrical lead is electrically coupled to the third electrical lead via the first electrical trace and the second electrical lead is electrically coupled to the fourth electrical lead via the second electrical trace.

13. The hard disk drive of claim 12, wherein the third and fourth electrical leads are electrically connected to hard disk drive components within the hard drive cavity.

14. The hard disk drive of claim 12, wherein the hard drive cavity contains a helium-enriched environment.

15. The hard disk drive of claim 12, wherein the electrical connector is coupled to the housing via one or more of soldering, adhesive, and epoxy that has a low helium permeability.

16. The hard disk drive of claim 12, wherein the outwardly positioned portion of the electrically insulating base can be inserted into a mating electrical receptacle.

17. The hard disk drive of claim 16, further comprising a securing mechanism that fastens the outwardly positioned portion of the electrically insulating base to the mating electrical receptacle.

18. The hard disk drive of claim 12, wherein the outwardly positioned portion of the electrically insulating base has a rectangular cross-sectional shape with two long peripheral sidewalls and two short peripheral sidewalls, wherein the first and second electrical leads are disposed on one of the long peripheral sidewalls of the outwardly positioned portion of the electrically insulating base.

19. The hard disk drive of claim 12, wherein the cross-sectional area of the electrical connector in the feedthrough aperture is less than about 100 square millimeters.

20. A hard disk drive, comprising:
a hermetically sealed housing substantially isolating a hard drive cavity containing a helium enriched environment from an exterior atmosphere, the housing comprising a feedthrough aperture; and
an electrical connector coupled to the housing and extending through the feedthrough aperture, the electrical connector comprising:
an electrically insulating base comprising at least first, second, and third layers of electrically insulating material with at least a first electrical trace extending between the first and second layers of electrically insulating material and at least a second electrical trace extending between the second and third layers of electrically insulating material, the electrically insulating base comprising an inwardly positioned portion disposed in the hard drive cavity, an outwardly positioned portion protruding into the exterior atmosphere, and a sealing portion disposed between the inwardly positioned portion and the outwardly positioned portion, the sealing portion being sealed to the housing, wherein a cross-section of the sealing portion that is co-planar with the cross-section of the feedthrough aperture comprises a first and second dimension, wherein the first dimension is at least 5 times the length of the second dimension
at least first and second electrical leads disposed on a same peripheral surface of the outwardly positioned portion of the electrically insulating base, and
at least third and fourth electrical leads disposed on the inwardly positioned portion of the electrically insulating base, wherein the first electrical lead is electrically coupled to the third electrical lead via the first electrical trace and the second electrical lead is electrically coupled to the fourth electrical lead via the second electrical trace.

* * * * *